US012796272B2

(12) United States Patent
Shin et al.

(10) Patent No.: US 12,796,272 B2
(45) Date of Patent: Nov. 10, 2026

(54) DISPLAY DEVICE

(71) Applicant: LG Display Co., Ltd., Seoul (KR)

(72) Inventors: Youngsub Shin, Paju-si (KR); ChaeKyung Lim, Paju-si (KR); DaeHeung Lee, Paju-si (KR); YoungHoon Kim, Paju-si (KR); Jungmin Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 730 days.

(21) Appl. No.: 17/888,964

(22) Filed: Aug. 16, 2022

(65) Prior Publication Data

US 2023/0056594 A1 Feb. 23, 2023

(30) Foreign Application Priority Data

Aug. 17, 2021 (KR) ........................ 10-2021-0108347
Dec. 30, 2021 (KR) ........................ 10-2021-0193502

(51) Int. Cl.

| | |
|---|---|
| ***H10K 59/38*** | (2023.01) |
| ***G02B 5/20*** | (2006.01) |
| ***H10K 50/844*** | (2023.01) |
| ***H10K 50/86*** | (2023.01) |
| ***H10K 59/122*** | (2023.01) |
| ***H10K 59/40*** | (2023.01) |

(52) U.S. Cl.

CPC ............. *H10K 59/38* (2023.02); *G02B 5/201* (2013.01); *G02B 5/206* (2013.01); *H10K 50/844* (2023.02); *H10K 50/865* (2023.02); *H10K 59/122* (2023.02); *H10K 59/40* (2023.02)

(58) Field of Classification Search

CPC .... H10K 59/38; H10K 50/844; H10K 50/865; H10K 59/122; H10K 59/40; H10K 59/8792

See application file for complete search history.

(56) References Cited

U.S. PATENT DOCUMENTS

| | | | | |
|---|---|---|---|---|
| 9,025,113 | B2 | 5/2015 | Yin et al. | |
| 2002/0167275 | A1* | 11/2002 | Bechtel | H01J 11/12 313/587 |
| 2013/0242240 | A1 | 9/2013 | Yin et al. | |
| 2017/0062529 | A1* | 3/2017 | Paek | G02B 5/201 |
| 2018/0095570 | A1* | 4/2018 | Hong | H10K 59/122 |
| 2018/0188837 | A1* | 7/2018 | Son | G06F 3/03547 |
| 2018/0197921 | A1* | 7/2018 | Kim | H10K 59/8792 |
| 2020/0203669 | A1 | 6/2020 | Shin et al. | |
| 2020/0257162 | A1* | 8/2020 | Lee | H10K 50/115 |
| 2021/0066648 | A1 | 3/2021 | Chung et al. | |
| 2021/0066670 | A1 | 3/2021 | Matsuoka | |

(Continued)

FOREIGN PATENT DOCUMENTS

| | | | |
|---|---|---|---|
| CN | 101055368 | A | 10/2007 |
| CN | 111352522 | A | 6/2020 |
| KR | 20160129932 | A | 11/2016 |

(Continued)

*Primary Examiner* — Marlon T Fletcher
*Assistant Examiner* — Samuel Jonathan Smith
(74) *Attorney, Agent, or Firm* — Seed Intellectual Property Law Group LLP

(57) ABSTRACT

A display device includes a black matrix that is substantially entirely exposed by openings in a color filter in an active area, making it possible to suppress occurrence of diffuse reflection in the color filter.

18 Claims, 17 Drawing Sheets

(56) References Cited

U.S. PATENT DOCUMENTS

| | | | | |
|---|---|---|---|---|
| 2021/0200365 | A1 | 7/2021 | Lee et al. | |
| 2021/0359008 | A1 * | 11/2021 | Zhang | G02B 5/223 |

FOREIGN PATENT DOCUMENTS

| | | | |
|---|---|---|---|
| KR | 20170010931 | A | 2/2017 |
| KR | 20170015713 | A | 2/2017 |
| KR | 20200078874 | A | 7/2020 |
| KR | 20210069254 | A | 6/2021 |
| KR | 20210083606 | A | 7/2021 |

* cited by examiner

DISPLAY DEVICE

CROSS-REFERENCE TO RELATED APPLICATION

This application claims priority from Korean Patent Application Nos. 10-2021-0108347 and 10-2021-0193502, filed on Aug. 17, 2021, and Dec. 30, 2021 respectively, which are hereby incorporated by reference for all purposes as if fully set forth herein.

BACKGROUND

Technical Field

Embodiments of the present disclosure relate to a display device.

Description of the Related Art

A display device that implements various types of information on a screen is a key technology in the era of information and communication technology, and plays a role of displaying various types of information in a display area.

The display device uses a polarizing plate that allows only a specific light to pass through to improve display quality or reduce the reflectance of external light to improve visibility.

Recently, in order to further maximize the portability of the display device, research is being conducted on a flexible display device that can be folded or rolled. However, there is a problem in that optical performance of the polarizing plate included in the display device is deteriorated when the display device is folded or rolled. Further, when the display device includes a polarizing plate, there is a problem in that there is a limit in reducing the thickness of the display device due to the thick thickness of the polarizing plate.

In order to solve the above problems, research to omit (or exclude) the polarizing plate from the display device is in progress. Research is being conducted to improve visibility by omitting the polarizing plate and using a color filter to reduce the reflectance of external light.

BRIEF SUMMARY

The inventors have realized that diffuse reflection occurs due to the color filter introduced instead of the polarizing plate. When the color filter is formed, there is a problem in that the color filter is formed in a reverse tapered shape, so that diffuse reflection occurs and a void occurs in a lower portion of the reverse taper, causing defects in the process. Further, there is a problem in that rainbow-shaped mura occurs due to the color filter. Thus, the inventors of the present disclosure have invented a display device that can suppress diffuse reflection by the color filter, prevent process defects, and prevent rainbow-shaped mura, because the color filter does not have a reverse tapered shape.

Embodiments of the present disclosure may provide a display device that includes a black matrix which is substantially entirely opened without being covered by the color filter, so the color filter does not have a reverse tapered shape, thereby suppressing diffuse reflection and preventing process defects caused by the color filter with the reverse tapered shape. In one embodiment, the black matrix is substantially entirely exposed by openings in the color filter.

Embodiments of the present disclosure may provide a display device capable of preventing rainbow-shaped mura from occurring because the thickness of the black matrix is greater than the thickness of the color filter.

Embodiments of the present disclosure may provide a display device that includes a black matrix positioned above the color filter, making it possible to prevent rainbow-shaped mura from occurring.

Embodiments of the present disclosure may provide a display device that includes an active area, an encapsulation layer, a black matrix positioned on the encapsulation layer, a color filter positioned on the encapsulation layer, and an adhesive layer positioned on the black matrix and the color filter.

The black matrix is substantially entirely opened in the active area without being covered by the color filter on a side of the adhesive layer. In one embodiment, the black matrix is substantially entirely exposed by openings in the color filter.

The color filter may not have a reverse tapered shape.

A thickness of the black matrix may be greater than a thickness of the color filter.

The black matrix may be positioned on the color filter.

According to embodiments of the present disclosure, there may be provided a display device in which the black matrix is substantially entirely opened without being covered by the color filter on a side of the adhesive layer in the active area, thereby suppressing occurrence of diffuse reflection in the color filter. In one embodiment, the black matrix is substantially entirely exposed by openings in the color filter.

According to embodiments of the present disclosure, there may be provided a display device in which the black matrix blocks light diffusely reflected from the color filter to prevent rainbow-shaped mura from occurring.

In one embodiment, a display device includes a substrate, a light emitting element on the substrate, an encapsulation layer on the light emitting element, a color filter on the encapsulation layer, a black matrix, and an adhesive layer. The color filter includes color filter patterns. The color filter patterns have sidewalls that are equally distant or increasingly distant from each other with increased proximity to the substrate. The black matrix laterally surrounds the color filter and is laterally separated from the light emitting element by a distance. The adhesive layer is on the color filter and the black matrix.

In one embodiment, a display device includes a light emitting element, a bank layer laterally surrounding the light emitting element, an encapsulation layer on the light emitting element, a color filter on the encapsulation layer, a black matrix disposed in openings of the color filter, and an adhesive layer on the color filter and the black matrix. The color filter includes color filter patterns. The color filter patterns have respective lower surfaces facing the encapsulation layer, and respective upper surfaces facing away from the encapsulation layer. The upper surfaces are smaller than the lower surfaces.

DESCRIPTION OF THE SEVERAL VIEWS OF THE DRAWINGS

The above and other features and advantages of the present disclosure will be more clearly understood from the following detailed description, taken in conjunction with the accompanying drawings, in which.

DETAILED DESCRIPTION

Figure 1:
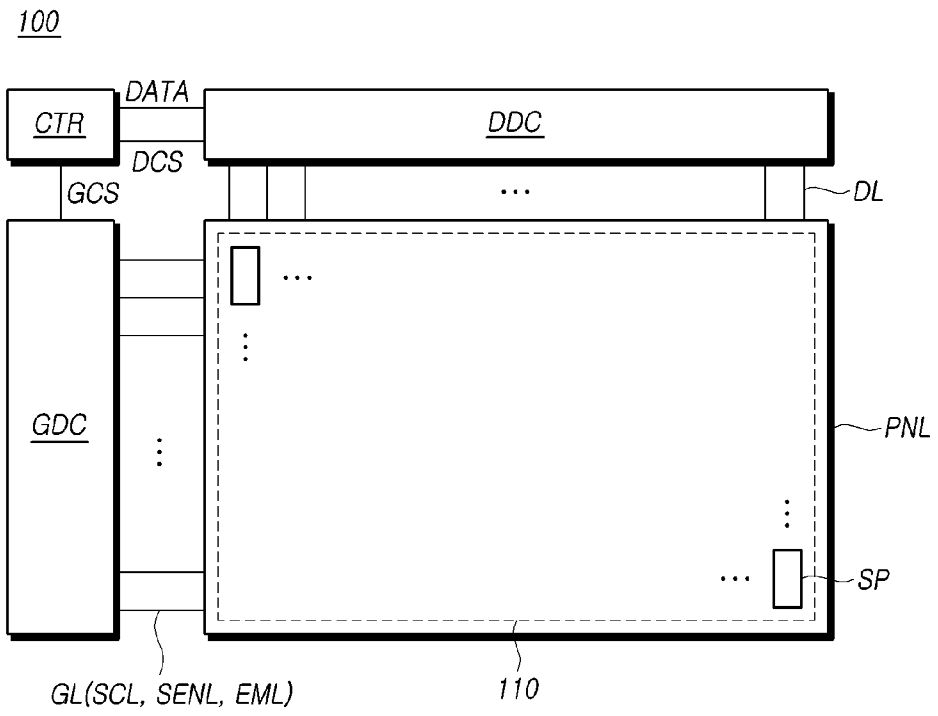
FIG. 1 is a system configuration diagram of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of", and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a system configuration diagram of an organic light emitting display device 100 according to embodiments of the present disclosure.

Referring to FIG. 1, the organic light emitting display device 100 according to embodiments of the present disclosure may include a display panel PNL on which a plurality of data lines DL and a plurality of gate lines GL are disposed, and a plurality of sub-pixels SP connected to the plurality of data lines DL and the plurality of gate lines GL are arranged in an active area 110, and a driving circuit for driving the display panel PNL.

Functionally, the driving circuit may include a data driving circuit DDC driving the plurality of data lines DL, a gate driving circuit GDC driving the plurality of gate lines GL, a controller CTR for controlling and the data driving circuit DDC and the gate driving circuit GDC, and the like.

In the display panel PNL, the plurality of data lines DL and the plurality of gate lines GL may be disposed to cross each other. For example, the plurality of data lines DL may be arranged in rows or columns, and the plurality of gate lines GL may be arranged in columns or rows. Hereinafter, for convenience of description, it is assumed that the plurality of data lines DL are arranged in rows and the plurality of gate lines GL are arranged in columns.

The controller CTR supplies various control signals DCS and GCS necessary or beneficial for driving operations of the data driving circuit DDC and the gate driving circuit GDC to control the data driving circuit DDC and the gate driving circuit GDC.

The controller CTR starts a scan according to the timing implemented in each frame, converts input image data input from the outside according to a data signal format used by the data driving circuit DDC, and outputs the converted image data DATA, and controls driving of the data at an appropriate time for the scan.

The controller CTR may be a timing controller used in a typical display technology, or a control device capable of further performing other control functions including the timing controller.

The controller CTR may be implemented as a separate component from the data driving circuit DDC, or may be integrated with the data driving circuit DDC to be implemented as an integrated circuit.

The data driving circuit DDC receives the image data DATA from the controller CTR and supplies a data voltage to the plurality of data lines DL to drive the plurality of data lines DL. Here, the data driving circuit DDC is also referred to as a source driving circuit.

The data driving circuit DDC may be implemented by including at least one source-driver integrated circuit S-DIC. Each source-driver integrated circuit S-DIC may include a shift register, a latch circuit, a digital-to-analog converter DAC, an output buffer, and the like. Each source-driver integrated circuit S-DIC may further include an analog-to-digital converter ADC in some cases.

Each source-driver integrated circuit S-DIC may be connected to a bonding pad of the display panel PNL by a tape automated bonding (TAB) method or a chip on glass (COG)

method, or may be directly disposed on the display panel PNL. In some cases, each source-driver integrated circuit S-DIC may be integrated and disposed on the display panel PNL. Alternatively, each source-driver integrated circuit S-DIC may be implemented in a chip-on-film (COF) method in which it is mounted on a source-circuit film connected to the display panel PNL.

The gate driving circuit GDC sequentially drives the plurality of gate lines GL by sequentially supplying a scan signal to the plurality of gate lines GL. Here, the gate driving circuit GDC is also referred to as a scan driving circuit.

The gate driving circuit GDC may be connected to a bonding pad of the display panel PNL by a tape automated bonding (TAB) method or a chip-on-glass (COG) method, or may be implemented in a gate-in-panel (GIP) type and directly disposed on the display panel PNL. In some cases, the gate driving circuit GDC may be integrated and disposed on the display panel PNL. Alternatively, the gate driving circuit GDC may be implemented in a chip-on-film (COF) method in which it is implemented with a plurality of gate driver integrated circuits G-DIC and mounted on a source-circuit film connected to the display panel PNL.

The gate driving circuit GDC sequentially supplies a scan signal of an on-voltage or an off-voltage to the plurality of gate lines GL under the control of the controller CTR.

When a specific gate line is opened by the gate driving circuit GDC, the data driving circuit DDC converts the image data DATA received from the controller CTR into an analog data voltage and supplies it to the plurality of data lines DL.

The data driving circuit DDC may be located on only one side (e.g., upper or lower side) of the display panel PNL, or in some cases, may be located on both sides (e.g., upper and lower sides) of the display panel PNL according to a driving method, a panel design method, and the like.

The gate driving circuit GDC may be located on only one side (e.g., left or right side) of the display panel PNL, or in some cases, located on both sides (e.g., left and right sides) of the display panel PNL according to a driving method, a panel design method, and the like.

The plurality of gate lines GL disposed on the display panel PNL may include a plurality of scan lines SCL, a plurality of sense lines SENL, and a plurality of emission control lines EML. The scan lines SCL, the sense lines SENL, and the emission control lines EML are wirings transferring different types of gate signals (scan signal, sense signal, and emission control signal) to gate nodes of different types of transistors (scan transistors, sense transistors, and emission control transistors).

Figure 2:
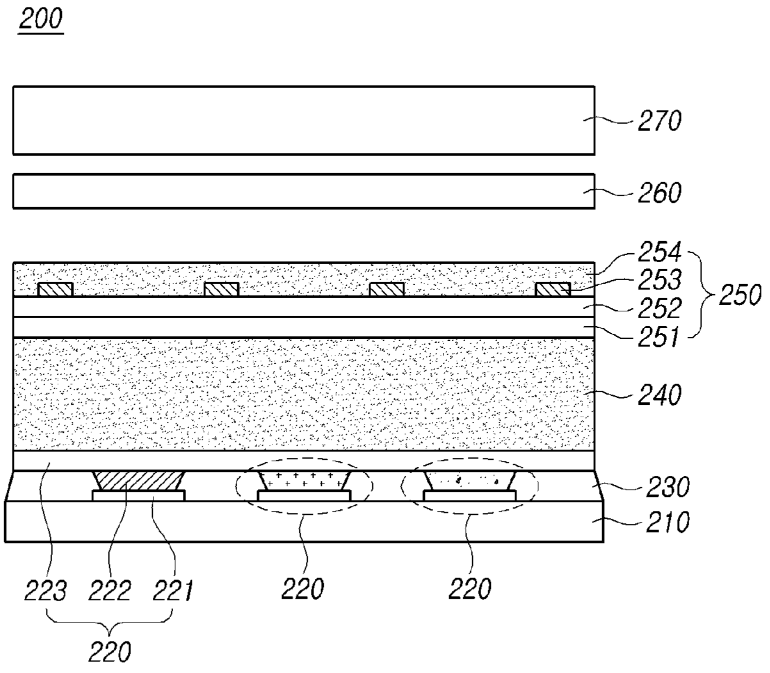
FIGS. 2 and 3 are cross-sectional views of a display device according to comparative examples of the present disclosure.

FIG. 2 is a cross-sectional view of a display device according to a comparative example of the present disclosure.

Referring to FIG. 2, a display device 200 may include a substrate 210, and a light emitting element 220, a bank layer 230, an encapsulation layer 240, a touch-on-encapsulation (or touch-on-encapsulation electrode layer) TOE 250, a polarizing plate 260 and a cover window 270, all of which are positioned on the substrate 210.

The substrate 210, on which various circuit elements constituting the display device are positioned, may be a plastic substrate such as glass or polyimide, but the type thereof is not particularly limited.

The light emitting element 220 may include a first electrode 221, a light emitting layer 222, and a second electrode 223. The second electrode 223 may be a common electrode of a plurality of light emitting elements.

The first electrode 221 may be a transparent electrode or a reflective electrode, and may be an anode electrode or a cathode electrode.

The second electrode 223 may be a transparent electrode or a reflective electrode, and may be an anode electrode or a cathode electrode.

The light emitting layer 222 may be positioned between the first electrode 221 and the second electrode 223.

The light emitting element 220 may be an organic light emitting diode (OLED) in which the light emitting layer 222 includes a layer including an organic material. Alternatively, the light emitting element 220 may be a quantum dot light emitting diode QLED using quantum dots in the light emitting layer.

The encapsulation layer 240 is a layer that protects circuit elements such as the light emitting element 220 positioned on the substrate 210 from moisture and oxygen outside the display device 200, and may include one or more organic layers, inorganic layers, or a combination thereof.

The touch-on-encapsulation electrode layer TOE 250 may include a first touch insulating layer 251, a second touch insulating layer 252, a touch electrode 253, and a touch encapsulation layer 254.

The display device 200 according to the comparative example may include the polarizing plate 260, thereby reducing external light reflectance. However, the light emitted from the light emitting element 220 toward the cover window 270 as the viewing surface passes through the polarizing plate 260. Since the polarizing plate 260 serves to selectively transmit light, there is a problem in that transmission efficiency is reduced by the polarizing plate 260.

Figure 3:
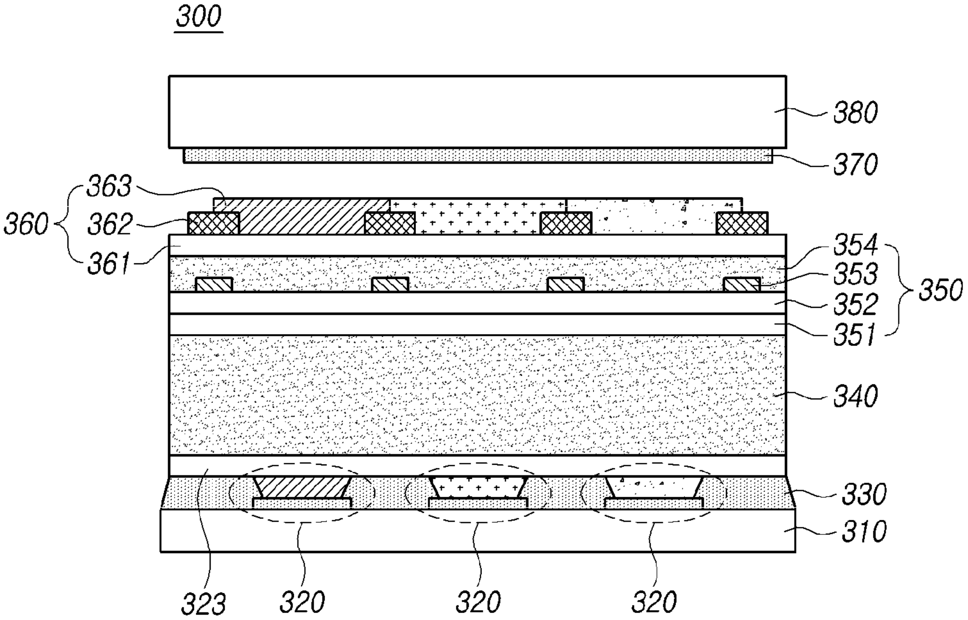

FIG. 3 is a cross-sectional view of a display device according to a comparative example of the present disclosure.

Referring to FIG. 3, a display device 300 may include a substrate 310, and a light emitting element 320, a bank layer 330, an encapsulation layer 340, a touch-on-encapsulation electrode layer TOE 350, a color filter-on-encapsulation COE 360, an adhesive layer 370, and a cover window 380, all of which are positioned on the substrate 310. The light emitting element 320 may have structure similar to that of the light emitting element 220 of FIG. 2. A second electrode 323 of the light emitting element 320 is labeled in FIG. 3 for clarity of illustration.

The encapsulation layer 340 is a layer that protects circuit elements such as the light emitting element 320 positioned on the substrate 310 from moisture and oxygen outside the display device 300, and may include a plurality of layers.

The touch-on-encapsulation electrode layer TOE 350 may include a first touch insulating layer 351, a second touch insulating layer 352, a touch electrode 353, and a touch encapsulation layer 354.

The color filter-on-encapsulation COE 360 includes a color filter substrate 361, a black matrix 362, and a color filter 363.

Unlike the display device 200 described above, the display device 300 does not include a polarizing plate, but includes the color filter-on-encapsulation COE 360 instead of the polarizing plate.

However, in the display device 300 according to the comparative example, the color filter-on-encapsulation COE 360 is formed after the light emitting element 320 is formed. Since circuit elements such as the light emitting element 320 may be damaged at a high temperature, the color filter-on-encapsulation COE 360 is formed at a low temperature. Accordingly, there is a problem in that the color filter 363 has a reverse tapered shape. This will be described later with reference to FIG. 4 and the like.

Figure 4:
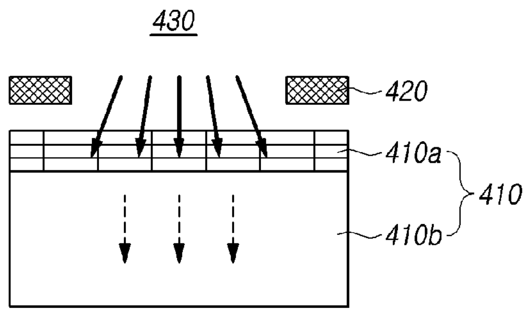
FIGS. 4 to 6 are views illustrating a part of a manufacturing process of a display device according to comparative examples of the present disclosure.

FIG. 4 illustrates a process 430 of exposing a color filter forming material during the patterning process of the color filter 363 of the display device 300.

Referring to FIG. 4, in order to form a color filter pattern, light may be selectively irradiated to a color filter forming material 410 using a mask 420. The light passing through the mask is incident on the color filter forming material 410. The color filter forming material 410 includes a color material such as a pigment that absorbs light of a specific wavelength so as to function as a color filter. However, since the color material absorbs incident light, a surface 410*a* of the color filter forming material 410 is sufficiently cured by exposure, but light may not sufficiently reach a deep portion 410*b* of the color filter forming material 410, so that photocuring may not proceed sufficiently.

Figure 5:
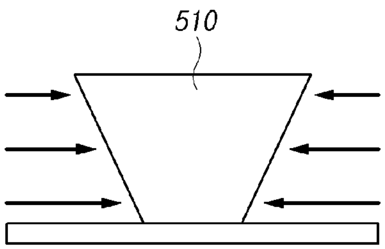

FIG. 5 illustrates a process of developing a color filter forming material during a patterning process of the color filter 363 of the display device 300.

Referring to FIG. 5, the developed color filter forming material 510 may have a reverse tapered shape. This is because, as described in FIG. 4, sufficient photocuring proceeds on the surface of the material by exposure, but in the deep portion of the material, the colorant contained in the material absorbs light, so that a sufficient amount of light does not reach, so photocuring does not proceed sufficiently. Accordingly, when the development is performed, more material of the surface layer portion having sufficiently photocured remains, and the material of the deep portion where photocuring is not sufficiently advanced is removed, so that the color filter may have a reverse tapered shape. It should be understood that "reverse tapered shape" includes the meaning that, for a structural feature, a horizontal surface proximal the substrate 310 (see FIG. 3) has at least one dimension that is smaller than a horizontal surface distal the substrate 310. For example, the lower surface of the developed color filter forming material 510 is narrower in the cross-sectional view of FIG. 5 than the upper surface thereof. "Reverse tapered shape" also includes the meaning that distance between opposing sidewalls of a structural feature increases with increased distance from the substrate 310. For example, the sidewalls of the developed color filter forming material 510 are closer together near the substrate 310, and become gradually further apart further away from the substrate 310. "Reverse tapered shape" may also refer to an angle between the upper surface of a structural feature and one or more sidewalls of the structural feature being less than 90 degrees. For example, the upper surface of the developed color filter forming material 510 forms angles with the left and right sidewalls thereof that are less than 90 degrees.

Figure 6:
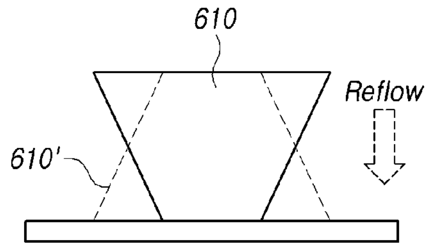

FIG. 6 illustrates a process of baking a color filter forming material during a patterning process of the color filter 363 of the display device 300.

In the display device 300 according to the comparative example, since the color filter is formed after the light emitting element 320 is formed, the process of baking the color filter forming material is performed at a low temperature of about 100° C., in order to prevent the light emitting element from being damaged. However, when the baking process is performed at a low temperature, unlike the baking process performed at a sufficiently high temperature, reflow of a color filter forming material 610 hardly occurs. When reflow occurs, the color filter forming material 610 having a reverse tapered shape is deformed into a tapered shape 610', but when the baking process is performed at a low temperature, the color filter forming material 610 maintains the reverse tapered shape.

Figure 7:
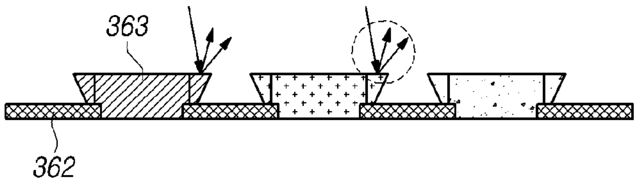
FIGS. 7 and 8 are diagrams illustrating that the display quality is deteriorated in a color filter of a display device according to comparative examples of the present disclosure.

FIG. 7 is a cross-sectional view of a portion of the display device 300.

Referring to FIG. 7, the display device 300 may include the black matrix 362 and the color filter 363. The color filter 363 may have a reverse tapered shape as described above.

The black matrix 362 is positioned between a plurality of color filter patterns constituting the color filter 363 to prevent color mixing at the boundary of the color filter patterns and to reduce the reflectance of the display device. However, when the color filter 363 has a reverse tapered shape, external light may not be incident on the black matrix, but may be incident on the reverse tapered portion of the color filter 363 having a higher reflectance than that of the black matrix. Accordingly, when the color filter 363 has a reverse tapered shape, the reflectance of the display device increases and visibility is deteriorated.

Figure 8:
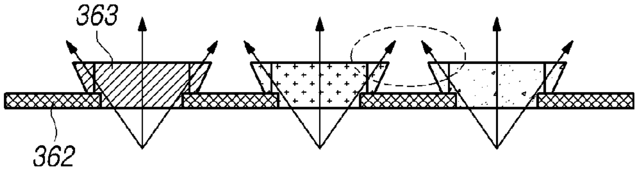

FIG. 8 is a cross-sectional view of a portion of the display device 300.

Referring to FIG. 8, light emitted from the light emitting element may be incident on the color filter 363 having a reverse tapered shape. There is no problem with the light incident on the center of the color filter 363, but the light incident on the periphery of the color filter 363, which has a reverse tapered shape, may have different luminance and color than when the color filter 363 does not have the reverse tapered shape.

When the color filter pattern has a reverse tapered shape, problems may occur in terms of processing in addition to the optical problems described with reference to FIGS. 7 and 8. For example, if a subsequent process is performed after the color filter pattern having the reverse tapered shape is formed, voids may occur under the color filter pattern having the reverse tapered shape, and accordingly, there may be a problem in that the display device is stained or the layer is peeled off during the process.

Figure 9:
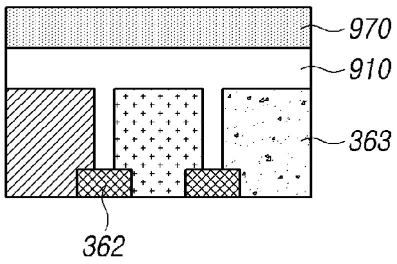
FIG. 9 is a cross-sectional view of a display device according to a comparative example of the present disclosure.

FIG. 9 is a cross-sectional view of a display device according to a comparative example of the present disclosure. More specifically, in the display device 300 described with reference to FIG. 3, it may be a cross-sectional view of a portion of the color filter-on-encapsulation COE 360 on the encapsulation layer.

Referring to FIG. 9, the display device may include an overcoat layer 910 and an adhesive layer 970, which are positioned on the black matrix 362 and the color filter 363.

Since the color filter 363 shown in FIG. 9 is also formed through the process described with reference to FIGS. 4 to 6, it may have a reverse tapered shape. Accordingly, the color filter shown in FIG. 9 may have the problems described with reference to FIGS. 7 and 8. Hereinafter, the display device according to embodiments of the present disclosure will be described with reference to FIG. 10 and the like. In describing the display device according to embodiments of the present disclosure, a configuration not specifically described may be the same as a corresponding configuration of the display device according to the comparative example of the present disclosure described above.

Figure 10:
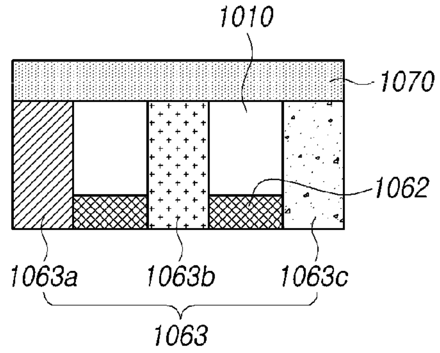
FIGS. 10 to 15 are cross-sectional views of a display device according to embodiments of the present disclosure.

FIG. 10 is a cross-sectional view of a display device 100 according to embodiments of the present disclosure. More specifically, FIG. 10 may be a cross-sectional view of a portion of a color filter-on-encapsulation COE of the display device.

Referring to FIG. 10, the display device 100 includes an active area (not shown), an encapsulation layer (not shown), a black matrix 1062 positioned on the encapsulation layer, a color filter 1063 positioned on the encapsulation layer, and an adhesive layer 1070 positioned on the black matrix 1062 and the color filter 1063.

The black matrix 1062 is substantially entirely opened without being covered by the color filter 1063 on a side of the adhesive layer 1070 in the active area. Since the black matrix 1062 located in the active area is opened without being covered by the color filter 1063, the black matrix 1062 is not covered by the color filter 1063 when viewed from a side of the adhesive layer 1070, i.e., from the side where the display device 100 displays an image. Accordingly, the color filter 1063 does not have a reverse tapered shape, and the black matrix 1062 having a lower reflectivity than the color filter 1063 may occupy a larger area, so that the display device 100 may reflect less external light incident from the side of the adhesive layer 1070, reducing external light reflection. It should be understood that a first structural feature that is "substantially entirely opened without being covered" by a second structural feature is a structural feature that is exposed by openings in a material layer that makes up the second structural feature. The exposure may be complete or substantially complete. For example, in the view of FIG. 10, the black matrix 1062 is located in openings of the color filter 1063 (e.g., between first, second and third color patterns 1063*a*, 1063*b*, 1063*c* thereof). Because sidewalls of the color filter 1063 are vertical (or substantially vertical), as shown, no substantial overhang of the color filter 1063 is present over the black matrix 1062. As such, in a top view looking down from the perspective of the adhesive layer 1070, the upper surface of the black matrix 1062 is entirely visible or substantially entirely visible relative to the color filter 1063 (e.g., disregarding overcoat layer 1010, which may inhibit visibility if opaque or partially opaque).

The color filter 1063 may include a plurality of color filter patterns. The color filter 1063 may include a first color filter pattern 1063*a*, a second color filter pattern 1063*b*, and a third color filter pattern 1063*c*. Each color filter pattern may have a different color from others of the color filter patterns. It should be understood that "does not have a reverse tapered shape" includes the meaning that a structural feature (e.g., the color filter 1063) has an upper surface smaller or equal in size to a lower surface thereof, has opposing sidewalls that are equally distant or increasingly distant from each other with increased proximity to the substrate 310, has an angle between the upper surface and one or more sidewalls thereof that is 90 degrees (e.g., vertical) or more, or a combination thereof. For example, the second color filter pattern 1063*b* has an upper surface that is equal (or substantially equal) in size to a lower surface thereof. Sidewalls of the second color filter pattern 1063*b* are equally distant (or substantially equally distant) from each other with increased proximity to the substrate 310. An angle between the upper surface and either sidewall of the second color filter pattern 1063*b* is 90 degrees or substantially 90 degrees, or greater than 90 degrees.

The display device 100 may include an overcoat layer 1010 positioned between the black matrix 1062 and the adhesive layer 1070. The overcoat layer 1010 may serve to planarize the color filter 1063. It should be understood that "planarize" includes the meaning of causing upper surfaces of the color filter patterns 1063*a*, 1063*b*, 1063*c* and an upper surface of the overcoat layer 1010 to be coplanar with each other or substantially coplanar with each other.

In addition, the overcoat layer 1010 may be formed by patterning before the color filter 1063 is formed. For example, the overcoat layer 1010 may be formed by patterning the black matrix 1062 on the color filter substrate and then patterning the overcoat layer 1010 on the black matrix 1062. As another example, the overcoat layer 1010 may be formed by patterning the overcoat layer 1010 on the black matrix layer, then the black matrix 1063 may be patterned through openings in the overcoat layer 1010.

Unlike the color filter 1063, which may be required to absorb light of a selected wavelength or wavelengths, the overcoat layer 1010 is not required to absorb light of a specific wavelength or wavelengths, so unlike the color filter 1063, the overcoat layer 1010 does not contain a color material such as a pigment that absorbs light, or even if the overcoat layer 1010 does contain a color material, the overcoat layer 1010 contains a much smaller amount than that contained by the color filter 1063. Accordingly, in the process of patterning the overcoat layer 1010, unlike the process of patterning the color filter 1063 including the color material described with reference to FIGS. 4 to 6, the overcoat layer 1010 is not formed in a reverse tapered shape, and a more elaborate pattern may be formed.

When the color filter 1063 is formed after the overcoat layer 1010 is formed, the color filter 1063 is not formed by the process described with reference to FIGS. 4 to 6. For example, since the color filter 1063 may be formed to be positioned only in a portion where the patterned overcoat layer 1010 is not formed (e.g., in openings in the patterned overcoat layer 1010), the color filter 1063 may be formed without a reverse tapered shape.

Accordingly, since the color filter 1063 having no reverse tapered shape can be formed easily in the display device 100, it is possible to prevent an increase in reflectance or a decrease in luminance of emitted light and change in color coordinates by the color filter having a reverse tapered shape.

The overcoat layer 1010 may be a layer transparent to visible light. The overcoat layer 1010 may be a layer including an organic material.

The color filter 1063 may be in direct contact with the adhesive layer 1070. Referring to FIG. 9, in the display device 300 according to the comparative example, an overcoat layer 910 for planarizing the color filter 363 may be positioned between the color filter 363 and the adhesive layer 970. Referring to FIG. 10, the color filter 1063 may directly contact the adhesive layer 1070. Accordingly, since the thickness of the color filter may be further reduced, the distance at which the black matrix 1063 is spaced apart from the light emitting element in the active area may be further narrowed, so that the area occupied by the black matrix 1063 in the active area can be increased and the display device may have a lower reflectivity.

The adhesive layer 1070 may have a transmittance that varies according to one or more wavelengths in the visible light range. The fact that the adhesive layer 1070 has a transmittance that varies according to the wavelength in the visible light range may mean that the adhesive layer 1070 has different transmittances for light of opposite or different wavelengths. When the adhesive layer 1070 has a transmittance that changes according to wavelength in the visible light range, external light passes through the adhesive layer 1070 without changing the color of the light that is emitted from the light emitting element (not shown) and passes through the color filter 1063. Thus, there may be provided a display device in which reflection from the black matrix 1062 or color filter 1063 can be suppressed, so it is possible to effectively suppress external light reflection even without including a polarizer.

When the adhesive layer 1070 has a transmittance that varies according to wavelength in the visible light range, the overcoat layer 1010 may be transparent to light in the visible light range.

Figure 11:
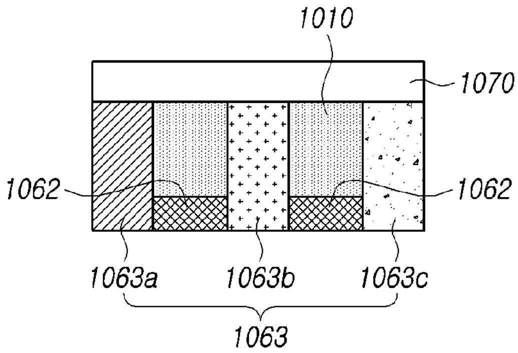

FIG. 11 is a cross-sectional view of a display device according to embodiments of the present disclosure. More specifically, FIG. 11 may be a cross-sectional view of a portion of the color filter-on-encapsulation COE of the display device.

In the description of the display device illustrated in FIG. 11, a configuration not specifically described may be the same as a corresponding configuration of the display device according to embodiments of the present disclosure described above with reference to FIG. 10.

Referring to FIG. 11, the overcoat layer 1010 may have transmittance that varies according to wavelength in the visible light range. The overcoat layer 1010 having a transmittance that varies according to the wavelength in the visible light range may mean that the overcoat layer 1010 has different transmittances for light of opposite or different wavelengths. When the overcoat layer 1010 has a transmittance that changes according to a wavelength in the visible light range, the adhesive layer 1070 may be transparent to light in the visible light range. In this example, since the light emitted from the light emitting element (not shown) can pass through the color filter 1063 and the transparent adhesive layer 1070, the transmission efficiency can be increased or maximized. Since the light incident from the outside and passing through the transparent adhesive layer 1070 must pass through the overcoat layer 1010 having different transmittance depending on the wavelength before being reflected from the black matrix 1062, the external light reflectance may be reduced, improving visibility of the display device.

Figure 12:
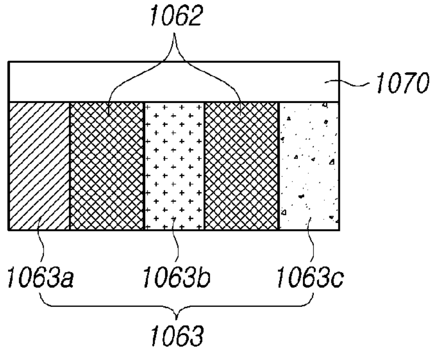

FIG. 12 is a cross-sectional view of a display device according to embodiments of the present disclosure. More specifically, FIG. 12 may be a cross-sectional view of a portion of the color filter-on-encapsulation COE of the display device.

In the description of the display device illustrated in FIG. 12, a configuration not specifically described may be the same as a corresponding configuration of the display device according to embodiments of the present disclosure described with reference to FIG. 10 above.

Referring to FIG. 12, the black matrix 1062 may be a matrix having a gray color. That is, the black matrix 1062 may have a predetermined or selected transmittance capable of transmitting a portion of the incident light rather than blocking the light.

The black matrix 1062 may include black nanoparticles and white nanoparticles. The type of black nanoparticles is not particularly limited as long as the black nanoparticles are added to the black matrix in the technical field of the present disclosure. For example, the black nanoparticles may be one or more selected from carbon black and lactam black. The white nanoparticles may be, for example, titanium dioxide $TiO_2$. Transmittance and reflectivity of the black matrix 1062 may be determined according to the content (e.g., ratio) of black nanoparticles and white nanoparticles included in the black matrix 1062.

When the black matrix 1062 includes both black nanoparticles and white nanoparticles, it is easier to satisfy the reflectance and transmittance beneficial for the black matrix of the display device. For example, when the black matrix 1062 includes only white nanoparticles, the transmittance is high, so that the display device has excellent efficiency and brightness, but there is a problem in that the visibility of the display device is deteriorated due to the high reflectance. When the black matrix 1062 includes only black nanoparticles, the reflectance of the display device is low, so that visibility is excellent, but there is a problem in that the efficiency and brightness of the display device are deteriorated due to the very low transmittance. When the black matrix 1062 includes both black nanoparticles and white nanoparticles, the display device may have excellent reflectance and transmittance.

The black matrix 1062 may include a polymer. For example, the polymer may be one or more of a novolac-based polymer, an acryl-based polymer, a cardo-based polymer, and a polyimide-based polymer.

The black matrix 1062 may include a monomer. For example, the monomer may include an ester and/or a urethane functional group as an acryl-based monomer. For example, it may be an acrylic monomer including a functional group of 2 to 14 carbon atoms.

The black matrix 1062 may include a plurality of layers. For example, the black matrix 1062 may include a first layer and a second layer. The first layer is a layer used as a black matrix in the technical field of the present disclosure, and may include, for example, black nanoparticles. The second layer may be a layer including white nanoparticles. Since the black matrix 1062 includes the second layer including the white nanoparticles, it may have a low reflectance with high transmittance, thereby preventing the occurrence of mura in the form of a rainbow.

The first layer may be located on the lower side (e.g., proximal the substrate 310) and the second layer may be located on the upper side (e.g., distal the substrate 310), and the first layer may be located on the upper side and the second layer may be located on the lower side.

The color filter may include a first color filter pattern 1063*a*, a second color filter pattern 1063*b*, and a third color filter pattern 1063*c*. The first color filter pattern 1063*a*, the second color filter pattern 1063*b*, the third color filter pattern 1063*c*, and the black matrix 1062 may have substantially the same or the same thickness. When the color filter patterns 1063*a*, 1063*b*, and 1063*c* and the black matrix 1062 have substantially the same or the same thickness, it is possible to more effectively prevent the rainbow-shaped mura from appearing. Referring to FIG. 12, the black matrix 1062 and the adhesive layer 1070 may be in direct contact.

Figure 13:
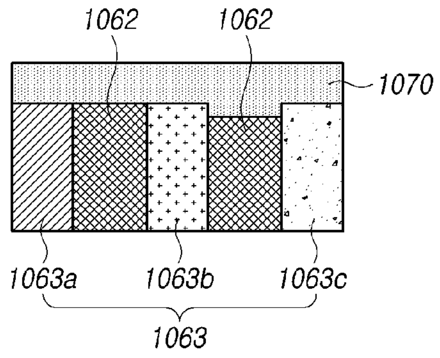

FIG. 13 is a cross-sectional view of a display device according to embodiments of the present disclosure. More specifically, FIG. 13 may be a cross-sectional view of a portion of the color filter-on-encapsulation COE of the display device.

In describing the display device shown in FIG. 13, a configuration not specifically described may be the same as a corresponding configuration of the display device according to embodiments of the present disclosure described with reference to FIG. 10 above.

Referring to FIG. 13, the black matrix 1062 and the adhesive layer 1070 may be in direct contact. When the black matrix 1062 and the adhesive layer 1070 are in direct contact, the level difference between the color filter 1063 and the black matrix 1062 may be flattened by the adhesive layer 1070. For example, the adhesive layer 1070 may have a substantially level or level upper surface, even if the lower surface thereof is not level due to presence of the black matrix 1062 having lower thickness than the color filter 1063.

The color filter 1063 may include a first color filter pattern 1063*a* and a second color filter pattern 1063*b*. The first color filter pattern 1063*a* may have substantially the same thickness as the black matrix 1062 (e.g., the black matrix 1062 between the first color filter pattern 1063*a* and the second color filter pattern 1063*b*). In this example, the thickness of the second color filter pattern 1063*b* may be greater than that of the black matrix 1062 (e.g., the black matrix 1062 between the second color filter pattern 1063*b* and the third color filter pattern 1063*c*). When the thickness of the second color filter pattern 1063*b* is greater than that of the black matrix 1062, the display device may have a lower reflectance.

The adhesive layer 1070 may be a transparent adhesive layer, and may have transmittance that varies according to wavelength in the visible light range.

Figure 14:
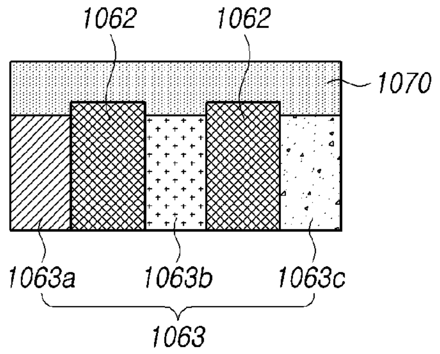

FIG. 14 is a cross-sectional view of a display device according to embodiments of the present disclosure. More specifically, FIG. 14 may be a cross-sectional view of a portion of the color filter-on-encapsulation COE of the display device.

In the description of the display device shown in FIG. 14, a configuration not specifically described may be the same as a corresponding configuration of the display device according to embodiments of the present disclosure described with reference to FIG. 13 above.

Referring to FIG. 14, the thickness of the black matrix 1062 may be greater than the thickness of the color filter 1063. For example, the color filter 1063 may include a first color filter pattern 1063*a*, a second color filter pattern 1063*b*, and a third color filter pattern 1063*c*, and the black matrix 1062 may have a thickness greater than all thicknesses of the first, second and third color filter patterns 1063*a*, 1063*b*, 1063*c*. When the black matrix 1062 has the above-described thickness, the black matrix 1062 may block the light reflected from the boundary of the adjacent color filter patterns, making it possible to prevent the occurrence of rainbow-shaped mura caused by mixing of light reflected from the boundary of adjacent color filter patterns.

Figure 15:
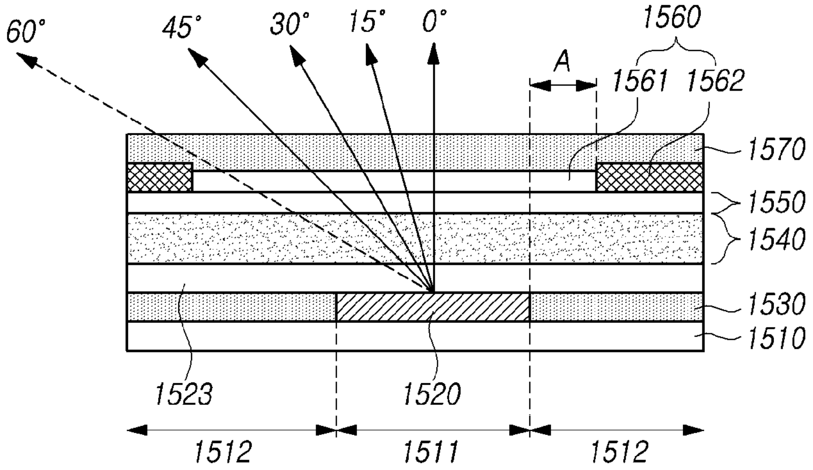

FIG. 15 is a cross-sectional view of a display device according to embodiments of the present disclosure.

In the description of the display device shown in FIG. 15, a configuration not specifically described may be the same as a corresponding configuration of the display device according to embodiments of the present disclosure described with reference to FIG. 14 above.

Referring to FIG. 15, the display device may include a substrate 1510, a light emitting element 1520 and a bank layer 1530 disposed on the substrate, an encapsulation layer 1540 disposed on the light emitting element, a touch-on-encapsulation electrode layer TOE 1550, a color filter-on-encapsulation COE 1560, and an adhesive layer 1570. The light emitting element 1520 may have structure similar to that of the light emitting element 220 of FIG. 2. A second electrode 1523 of the light emitting element 1520 is labeled in FIG. 15 for clarity of illustration.

The active area may include an opening portion 1511 and a non-opening portion 1512. The opening portion 1511 may be an area in which the bank layer 1530 is not formed and the light emitting element 1520 is opened (e.g., present) in the active area. The non-opening portion 1512 may be an area in which the light emitting element 1520 is not opened (e.g., is not present) because the bank layer 1530 is formed in the active area.

The color filter-on-encapsulation COE 1560 includes a color filter 1561 and a black matrix 1562.

The black matrix 1562 may be located in the non-opening portion 1512, and may be located to be spaced apart from the opening portion 1511 by a predetermined or selected distance A. Since the black matrix 1562 is spaced apart from the opening portion 1511 by the predetermined or selected distance A, light emitted in the side viewing angle direction instead of the front of the light emitting element 1520 is not blocked by the black matrix 1562, so sufficient luminance can be secured in the side viewing angle direction.

Figure 16:
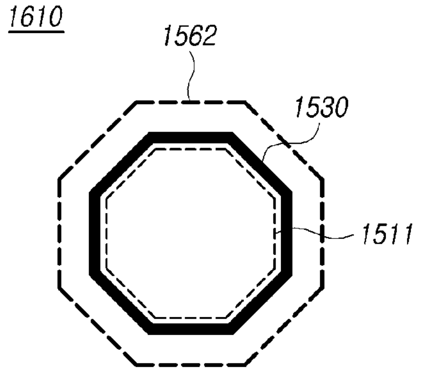
FIG. 16 is a plan view of a display device according to embodiments of the present disclosure.

FIG. 16 is a plan view of an active area 1610 of a display device.

Referring to FIG. 16, the opening portion 1511 is defined by (e.g., laterally surrounded by) the bank layer 1530. A light emitting element (not shown) may be positioned in the opening portion 1511. The light emitting element (not shown) may be in direct contact with the bank layer 1530. The bank layer 1530 shown in FIG. 16 is a portion of the bank layer 1530 adjacent to the light emitting element (not shown). It should be understood that the bank layer 1530 extends outward from the position shown in FIG. 16 toward other opening portions 1511 (not shown) neighboring the opening portion 1511 shown in FIG. 16.

The black matrix 1562 may be positioned in the non-opening portion where the bank layer 1530 is positioned. The black matrix 1562 may be positioned to be spaced apart from the opening portion 1511 by a predetermined or selected distance. Since the black matrix 1562 is spaced apart from the opening portion 1511 by a predetermined or selected distance and located around (e.g., laterally surrounding) the opening portion 1511, the size of the area in which the black matrix 1562 is opened (e.g., not present) may be much greater than the opening portion 1511 in which the bank layer 1530 is opened (e.g., not present). As such, when the black matrix 1562 is spaced apart from the opening portion 1511 by a predetermined or selected distance, the display device may have excellent luminance not only in the front but also in the viewing angle direction greater than or equal to a predetermined or selected value.

Figure 17:
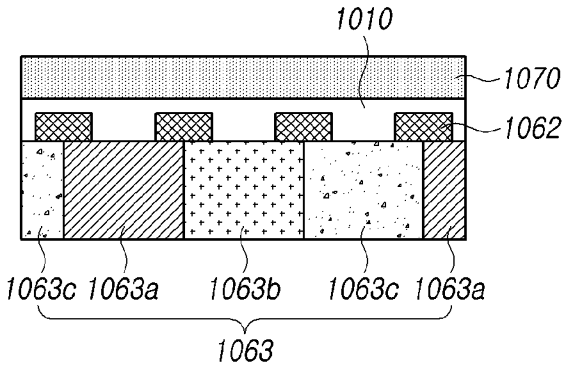
FIG. 17 is a cross-sectional view of a display device according to embodiments of the present disclosure.

FIG. 17 is a cross-sectional view of a display device according to embodiments of the present disclosure.

In describing the display device illustrated in FIG. 17, a configuration not specifically described may be the same as a corresponding configuration of the display device according to embodiments of the present disclosure described above with reference to FIG. 14.

Referring to FIG. 17, the display device may include a color filter 1063, a black matrix 1062, an overcoat layer 1010, and an adhesive layer 1070.

The black matrix 1062 may be positioned on the color filter 1063. Since the black matrix 1062 is positioned on the color filter 1063, it is possible to prevent a rainbow-shaped mura from occurring due to light reflected from the boundary between the color filter patterns 1063*a*, 1063*b*, and 1063*c* included in the color filter. This is because light reflected from the boundary between the color filter patterns 1063*a*, 1063*b*, and 1063*c* may be blocked by the black matrix 1062 positioned on the color filter. In some embodiments, as shown, the black matrix 1062 is positioned over interfaces of neighboring color filter patterns. For example, the black matrix 1062 is positioned over an interface between the first color filter pattern 1063*a* and the second color filter pattern 1063*b*. For example, the black matrix 1062 vertically overlaps interfaces between neighboring pairs of the color filter patterns.

A brief description of embodiments of the present disclosure described above is as follows.

The display device 100 includes an active area 110, an encapsulation layer 340, a black matrix 1062 positioned on the encapsulation layer, a color filter 1063 positioned on the encapsulation layer, and an adhesive layer 1070 positioned on the black matrix and the color filter.

The black matrix 1062 is substantially entirely opened without being covered by the color filter 1063 on the side of the adhesive layer 1070 in the active area.

The color filter 1063 may not have a reverse tapered shape.

The color filter 1063 may be in direct contact with the adhesive layer 1070.

The adhesive layer 1070 may have a transmittance that changes according to a wavelength in the visible light range.

The black matrix 1062 may include a first layer and a second layer. The first layer may include black nanoparticles, and the second layer may include white nanoparticles.

The color filter 1063 may include a first color filter pattern 1063*a*, a second color filter pattern 1063*b*, and a third color filter pattern 1063*c*. The first color filter pattern 1063*a*, the second color filter pattern 1063*b*, the third color filter pattern 1063*c*, and the black matrix 1062 may have substantially the same thickness.

The display device may further include an overcoat layer 1010 positioned between the black matrix 1062 and the adhesive layer 1070.

The overcoat layer 1010 may have a transmittance that changes according to a wavelength in the visible light range.

The black matrix 1062 and the adhesive layer 1070 may be in direct contact.

The color filter 1063 may include a first color filter pattern 1063*a* and a second color filter pattern 1063*b*, and the first color filter pattern 1063*a* may have substantially the same thickness as the black matrix 1062.

The color filter 1063 may include a first color filter pattern 1063*a* and a second color filter pattern 1063*b*, and the thickness of the second color filter pattern 1063*b* may be greater than the thickness of the black matrix 1062.

The active area 1610 may include an opening portion 1511 and a non-opening portion 1512, and the black matrix 1562 may be located in the non-opening portion 1512 and spaced apart from the opening portion 1511.

A thickness of the black matrix 1062 may be greater than a thickness of the color filter 1063.

The black matrix 1062 may be positioned on the color filter 1063.

The above description has been presented to enable any person skilled in the art to make and use the technical idea of the present disclosure, and has been provided in the context of a particular application and its requirements or benefits. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Technical ideas within the scope of equivalents of features of the disclosure should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

an active area;

an encapsulation layer;

a black matrix positioned on the encapsulation layer;

a color filter positioned on the encapsulation layer;

an adhesive layer positioned on the black matrix and the color filter; and an overcoat layer positioned between the black matrix and the adhesive layer, wherein in a direction between the encapsulation layer and the adhesive layer, the black matrix does not overlap the color filter in the active area, wherein the black matrix is in contact with the color filter only at side surfaces of the black matrix, and wherein the color filter and the overcoat layer are each in contact with the adhesive layer.

2. The display device of claim 1, wherein color filter patterns of the color filter have angles between respective upper surfaces and respective sidewalls thereof, the angles being greater than or equal to 90 degrees, the upper surfaces facing the adhesive layer.

3. The display device of claim 1, wherein the adhesive layer has a transmittance that varies according to wavelength in a visible light range.

4. The display device of claim 1, wherein the overcoat layer has a transmittance that varies according to wavelength in a visible light range.

5. The display device of claim 1, wherein the black matrix includes a first layer and a second layer, wherein the first layer includes black nanoparticles, and the second layer includes white nanoparticles.

6. The display device of claim 1, wherein the color filter includes a first color filter pattern, a second color filter pattern, and a third color filter pattern, wherein the first color filter pattern, the second color filter pattern, the third color filter pattern, and the black matrix have substantially a same thickness.

7. The display device of claim 1, wherein the black matrix and the adhesive layer are in direct contact with each other.

8. The display device of claim 1, wherein the color filter includes a first color filter pattern and a second color filter pattern, wherein the first color filter pattern has substantially a same thickness as the black matrix.

9. The display device of claim 1, wherein the color filter includes a first color filter pattern and a second color filter pattern, wherein a thickness of the second color filter pattern is greater than a thickness of the black matrix.

10. The display device of claim 1, wherein the active area includes an opening portion and a non-opening portion, wherein the black matrix is positioned in the non-opening portion and positioned to be spaced apart from the opening portion.

11. The display device of claim 1, wherein a thickness of the black matrix is greater than a thickness of the color filter.

12. The display device of claim 1, wherein the black matrix is positioned on the color filter.

13. A display device, comprising:

a substrate;

a light emitting element on the substrate;

an encapsulation layer on the light emitting element;

a color filter on the encapsulation layer, the color filter including color filter patterns, the color filter patterns having sidewalls that are equally distant or increasingly distant from each other with increased proximity to the substrate;

a black matrix laterally surrounding the color filter and laterally separated from the light emitting element by a distance;

an adhesive layer on the color filter and the black matrix; and an overcoat layer positioned between the black matrix and the adhesive layer, wherein the black matrix is in contact with the color filter only at side surfaces of the black matrix and in a direction between the encapsulation layer and the adhesive layer, the black matrix does not overlap with the color filter, and wherein the color filter and the overcoat layer are each in contact with the adhesive layer.

14. The display device of claim 13, further comprising:

a bank layer laterally surrounding the light emitting element;

wherein a first opening of the bank layer in which the light emitting element is positioned is smaller than a second opening of the black matrix in which the color filter is positioned.

15. The display device of claim 13, wherein the black matrix vertically overlaps interfaces between neighboring pairs of the color filter patterns.

16. A display device, comprising:

a light emitting element;

a bank layer laterally surrounding the light emitting element;

an encapsulation layer on the light emitting element;

a color filter on the encapsulation layer, the color filter including color filter patterns, the color filter patterns having:

respective lower surfaces facing the encapsulation layer; and respective upper surfaces facing away from the encapsulation layer;

wherein the upper surfaces are smaller than the lower surfaces;

a black matrix disposed in openings of the color filter;

an adhesive layer on the color filter and the black matrix; and an overcoat layer positioned between the black matrix and the adhesive layer, wherein the black matrix is in contact with the color filter only at side surfaces of the black matrix and in a direction between the encapsulation layer and the adhesive layer, the black matrix does not overlap with the color filter, and wherein the color filter and the overcoat layer are each in contact with the adhesive layer.

17. The display device of claim 16, further comprising a touch-on-encapsulation (TOE) between the encapsulation layer and the color filter.

18. The display device of claim 16, wherein the overcoat layer is positioned in the openings of the color filter.

* * * * *